(12) United States Patent
Miyashiro

(10) Patent No.: US 8,013,690 B2
(45) Date of Patent: Sep. 6, 2011

(54) ELECTRONICALLY TUNABLE, ABSORPTIVE, LOW-LOSS NOTCH FILTER

(75) Inventor: Kevin Miyashiro, Honolulu, HI (US)

(73) Assignee: TeraSys Technologies LLC, Honolulu, HI (US)

( * ) Notice: Subject to any disclaimer, the term of this patent is extended or adjusted under 35 U.S.C. 154(b) by 222 days.

(21) Appl. No.: 12/369,256

(22) Filed: Feb. 11, 2009

(65) Prior Publication Data

US 2009/0289744 A1 Nov. 26, 2009

Related U.S. Application Data

(60) Provisional application No. 61/055,143, filed on May 22, 2008.

(51) Int. Cl.
*H01P 5/12* (2006.01)
*H01P 5/22* (2006.01)
*H03H 7/01* (2006.01)

(52) U.S. Cl. ........ 333/176; 333/117; 333/120; 333/121; 333/174

(58) Field of Classification Search .......... 333/117, 333/120, 121, 174, 176
See application file for complete search history.

(56) References Cited

U.S. PATENT DOCUMENTS

| | | | | |
|---|---|---|---|---|
| 3,711,782 A * | 1/1973 | Perrero et al. | ................ | 330/254 |
| 4,207,547 A | 6/1980 | Buck | | |
| 4,426,630 A * | 1/1984 | Folkmann | ................ | 333/174 |
| 4,694,266 A * | 9/1987 | Wright | ................ | 333/196 |
| 4,701,724 A * | 10/1987 | Martin | ................ | 333/103 |
| 4,928,078 A * | 5/1990 | Khandavalli | ................ | 333/109 |
| 5,180,999 A * | 1/1993 | Edwards | ................ | 333/175 |
| 5,781,084 A | 7/1998 | Rhodes | | |
| 6,636,128 B2 * | 10/2003 | Rauscher | ................ | 333/175 |
| 6,924,714 B2 * | 8/2005 | Jain | ................ | 333/123 |
| 7,174,147 B2 | 2/2007 | Toncich et al. | | |
| 7,323,955 B2 | 1/2008 | Jachowski | | |
| 2006/0152304 A1 * | 7/2006 | Liang et al. | ................ | 333/176 |

OTHER PUBLICATIONS

Swartz et al, "Large-Area Varactor Diode . . . ", IEEE Trans. Electron Devices, Nov. 1980.

* cited by examiner

*Primary Examiner* — Robert Pascal
*Assistant Examiner* — Kimberly Glenn
(74) *Attorney, Agent, or Firm* — Leighton K. Chong

(57) ABSTRACT

An electronically tuned, absorptive, low-loss notch filter with high RF power handling capability is obtained using a four-port quadrature hybrid coupler connected to a matched pair of band pass resonator devices and resistive terminations. The notch filter design uses series-only tuning elements for the band pass resonator devices to raise the RF power handling of the band pass resonators far above conventional techniques while also being tunable at high speeds. The notch filter architecture and method can be used for interference cancellation in a wide range of wireless technologies, such as cellular phone, wireless routers, hand-held radios, satellite communications, and any other environments where there are a number of wireless technologies in close signal proximity.

18 Claims, 9 Drawing Sheets

Figure 1: Frequency response of conventional notch filter (Prior Art)

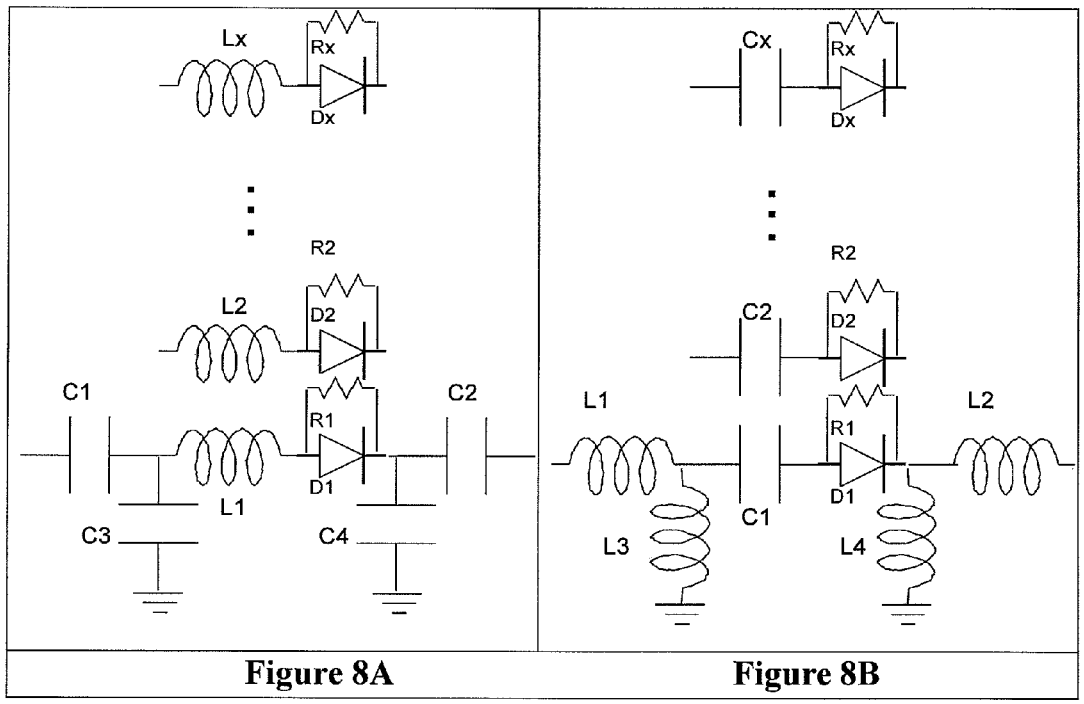
Figure 8A  Figure 8B
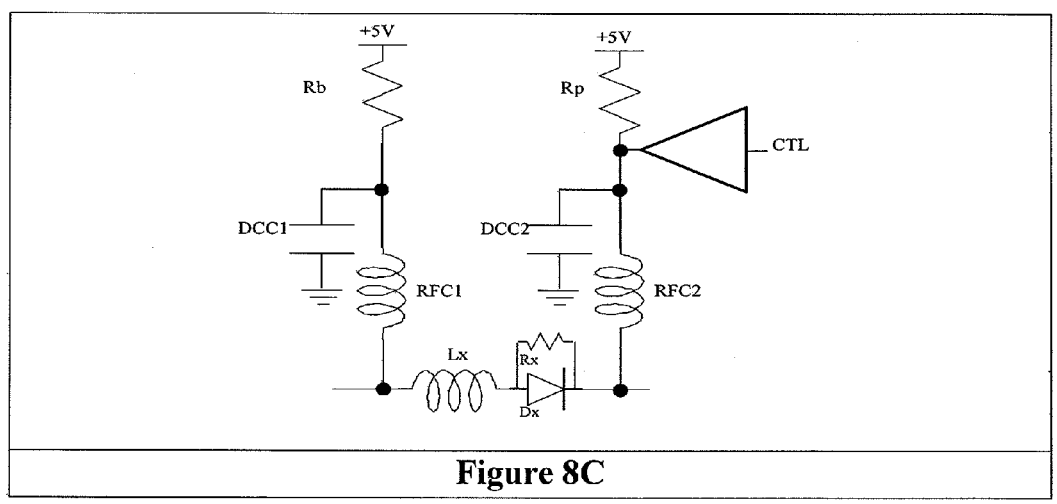
Figure 8C

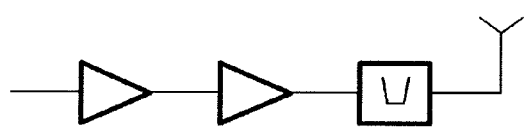
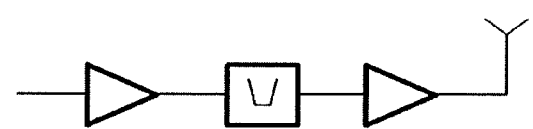
Figure 13A                     Figure 13B

ELECTRONICALLY TUNABLE, ABSORPTIVE, LOW-LOSS NOTCH FILTER

This U.S. patent application claims the priority filing date of U.S. Provisional Application 61/055,143 filed on May 22, 2008, entitled "Method for a High Order, High Power, Absorptive Band Reject Filter Using Low Order Band Pass Filters" by the same inventor in the present application.

The subject matter of this U.S. Patent Application was developed under a grant obtained through the Department of Defense SBIR Phase I program, under Contract No. N65538-08-M-0142, administered through Naval Sea Systems Command (NAVSEA), in the project entitled "RF Absorptive Filter (RAF)". The U.S. Government retains certain rights in the invention.

TECHNICAL FIELD

This invention generally relates to electronically tunable notch filters, and more particularly, to an improvement of an absorptive, low-loss notch filter capable of tolerating high RF power levels while being electronically tunable at high tuning speeds.

BACKGROUND OF INVENTION

Wireless technology has become an integral part of society with such devices as the pager, cellular phone, personal digital assistant (PDA), as well as networking technology such as wireless routers. With this explosion of wireless technology, there are many instances where a nearby wireless transmitter tends to overwhelm an adjacent receiver. Under these circumstances, it is possible to remove the offending transmit frequency by placing a notch filter at the output of the transmitter and tuning the notch filter to the frequency of the adjacent receiver.

As the RF power level of transmitters increase, it becomes problematic to use conventional notch filters, which reflect the energy at the notch frequency. An example of a commercially available conventional notch filter is the 4DRN40-422.75/X3-O/O notch filter offered by K&L Microwave at 2250 Northwood Drive Salisbury, Md. 21081. FIG. 1 illustrates the measured frequency response of this filter. The lower curve shows the S11 response, which reflects nearly all of the energy at the notch frequency. At the notch frequency, the S11 response rises to approximately −1 dB, which indicates that the reflected energy travels back towards the transmitter. At low RF power levels, this reflected energy can interact with the transmitted energy to create interference signals known as intermodulation distortion products. At high RF power levels, this reflected energy can even physically damage the transmitter.

Notch filters are commonly required to be tunable since it is not always known beforehand which frequencies are required to be removed from a spectrum. Methods of tuning are either mechanical or electrical, and vary significantly in terms of speed. Mechanical tuning mechanisms tend to be slow and can even be manual. Electronic tuning mechanisms are much faster. The fastest method of electronic tuning is to use solid state devices such as PIN diodes, Gallium Arsenide transistors, or other exotic devices. These devices are capable of switching speeds exceeding 1 microsecond and are used when the fastest switching speeds are required.

There have been many published methods for achieving notch filters but none have reported the ability to simultaneously deliver a notch filter that is absorptive with high RF power handling while still being electronically tunable. There have also been publications related to electronically tunable filters that report high RF power handling, but none have reported a means to simultaneously enable low loss, absorptive, high RF power handling, and fast electronic tuning of notch filters.

For example, U.S. Pat. No. 4,694,266, entitled "Notch Filter", issued to Wright on Sep. 15, 1987, disclosed a notch filter using a quadrature hybrid coupler and two SAW band pass filters. However, the SAW filters are incapable of being tuned electrically, and would reflect energy at the notch frequency, rendering this approach non-absorptive. It also did not disclose high RF power handling capabilities.

U.S. Pat. No. 4,207,547, entitled "Reflection Mode Notch Filter, issued to Buck on Jun. 10, 1980, disclosed quadrature hybrid devices to steer transmitted and reflected energy to provide an absorptive band reject filter. This approach, however, would require a high order band pass filter to implement a high order band reject filter. This approach also used a phase shifter, and therefore is inherently narrow band. Also, because the band pass filter is used in series, the equivalent loss of the notch filter must be at least equal to the band pass filter.

U.S. Pat. No. 7,323,955, entitled "Narrow-band Absorptive Bandstop Filter with Multiple Signal Paths," issued to Jachowski on Jan. 29, 2008, disclosed notch filtering with absorptive properties using directional couplers to steer signals as well as band pass filters to add and subtract signals to create the notch characteristic. While this approach provided a good absorptive characteristic, it required many additional components in a large circuit. Because it used band pass filters in series, the loss through the band pass filter must be taken into account and precludes the possibility of a low loss notch filter. It also did not disclose high RF power handling capabilities.

U.S. Pat. No. 5,781,084, entitled "Microwave Reflection Filter including a Ladder Network of Resonators Having Progressively Smaller Q Values," issued to Rhodes on Jul. 14, 1998, described a passive notch filter that is also absorptive. However, this device required the use of a 3 port circulator. Circulators are not low in loss, and more importantly, are not available at UHF frequencies and below, due to size and weight limits. It also did not disclose high RF power handling capabilities.

U.S. Pat. No. 7,174,147, entitled "Bandpass Filter with Tunable Resonator," issued to Toncich and Fabrega-Sanchez on Feb. 6, 2007, described a method for creating an electronically tunable band pass filter capable of tolerating high RF power levels. This is achieved by using a ferroelectric material as the electronically tunable element. However, ferroelectric materials do not react quickly, thus while this method did allow for electronic tuning, it is limited to applications where fast tuning speed is not a requirement.

A paper published by Swartz et. al., entitled "Large-area Varactor Diode for Electrically Tunable, High-Power UHF Bandpass Filter," published in November 1980 in the IEEE Transactions on Electron Devices, described a varactor designed for use in electronically tunable high power band pass filters. However, it did not describe a method for achieving this while simultaneously also having an absorptive characteristic.

SUMMARY OF INVENTION

A primary object of the present invention is, therefore, to provide an improvement of a notch filter with absorptive properties that is capable of being electronically tuned at fast tuning speeds while tolerating high RF power levels.

In a preferred embodiment, an electronic tunable, absorptive, low-loss notch filter is comprised of: a quadrature hybrid coupler with first, second, third, and fourth terminals, wherein the first terminal is a signal input terminal, the fourth terminal is a signal output terminal, and the second and third terminals are connected to respective resonator circuits in tandem, wherein the quadrature hybrid coupler operates to convert an incoming signal on the first terminal into two outgoing signals of equal amplitude and 90 degrees out of phase with the other which are passed to respective ones of the second and third terminals; a first electronically tuned band pass resonator having first and second terminals, wherein the second terminal of the quadrature hybrid coupler is connected to the first terminal of the first electronically tuned band pass resonator; a first resistive termination whose impedance is matched to an overall impedance of the notch filter, having a high side terminal connected to the second terminal of the first electronically tuned band pass resonator, and a low side terminal connected to a ground termination; a second electronically tuned band pass resonator having first and second terminals, wherein the third terminal of the quadrature hybrid coupler is connected to the first terminal of the second electronically tuned band pass resonator; and a second resistive termination whose impedance is matched to the overall impedance of the notch filter, having a high side terminal connected to the second terminal of the second electronically tuned band pass resonator, and a low side terminal connected to a ground termination.

In a preferred mode of operating the above-described notch filter, both the first and second electronically tuned band pass resonators are a matching pair and have their frequencies tuned equal to the frequency desired to be notched by the absorptive notch filter. Signals at the notch frequency are therefore passed and absorbed into the first and second resistive terminations. No energy is reflected back towards the quadrature hybrid coupler, thereby providing an absorptive response, and no signal energy is allowed to propagate. This results in the notch filter having a notch at the notch frequency. On the other hand, signals at out-of-notch frequencies are reflected back from the first and second band pass resonators and undergo a second phase shift through the quadrature hybrid coupler, resulting in reflected signals passed to the first (input) terminal that are 180 degrees out-of-phase and cancel each other, and reflected signals passed to the fourth (output) terminal that are in-phase and reinforce each other to pass a full signal from the notch filter with little or no loss. An electronically tunable, absorptive, low-loss notch filter is thus provided. The notch filter creates the notch response with benefits in improved power handling and lower cost.

In a particularly preferred embodiment, the electronically tunable band pass resonators of the notch filter obtains superior power handling capabilities by using only series tunable elements. The preferred band pass resonator has a first series capacitor connected to a first series inductor which is connected to a diode which in turn is connected to a second series capacitor. A first shunt capacitor couples the connection between the first series capacitor and the first series inductor to ground. A second shunt capacitor couples the connection between the diode and the second series capacitor to ground. The combination of the first series inductor and first series diode represents one of a plurality of parallel inductor/diode connections comprising an electronic tuning mechanism. Each diode is either turned on to present a low resistance path or turned off to present a high resistance path, which adjusts the total amount of inductance presented by the plurality of parallel combinations. An alternate embodiment, having the same functionality, may have a first series inductor connected to a first series capacitor, which is connected to a diode, which in turn is connected to a second series inductor, with a first shunt inductor coupling one side's connection to ground, and a second shunt inductor coupling the other side's connection to ground. The diode represents a series-only control for the center tuning element, which enables handling of high power uses. An array of tuning/diode series connections in parallel can be used as a selectable electronic tuning mechanism. The preferred embodiments using electronically tunable band pass resonators with series-only tuning elements have high power handling characteristics in the range of an order-of-magnitude higher than conventional filters.

BRIEF DESCRIPTION OF DRAWINGS

FIG. 8A shows an embodiment of a series-only electronically tunable band pass resonator, FIG. 8B shows an alternate embodiment, and FIG. 8C shows an electronic tuning mechanism for the band pass resonator.

FIG. 13A illustrates use of the notch filter at the output of a transmitter, and FIG. 13B illustrates use of the notch filter at the input of the transmitter.

DETAILED DESCRIPTION OF PREFERRED EMBODIMENTS

Figure 1:
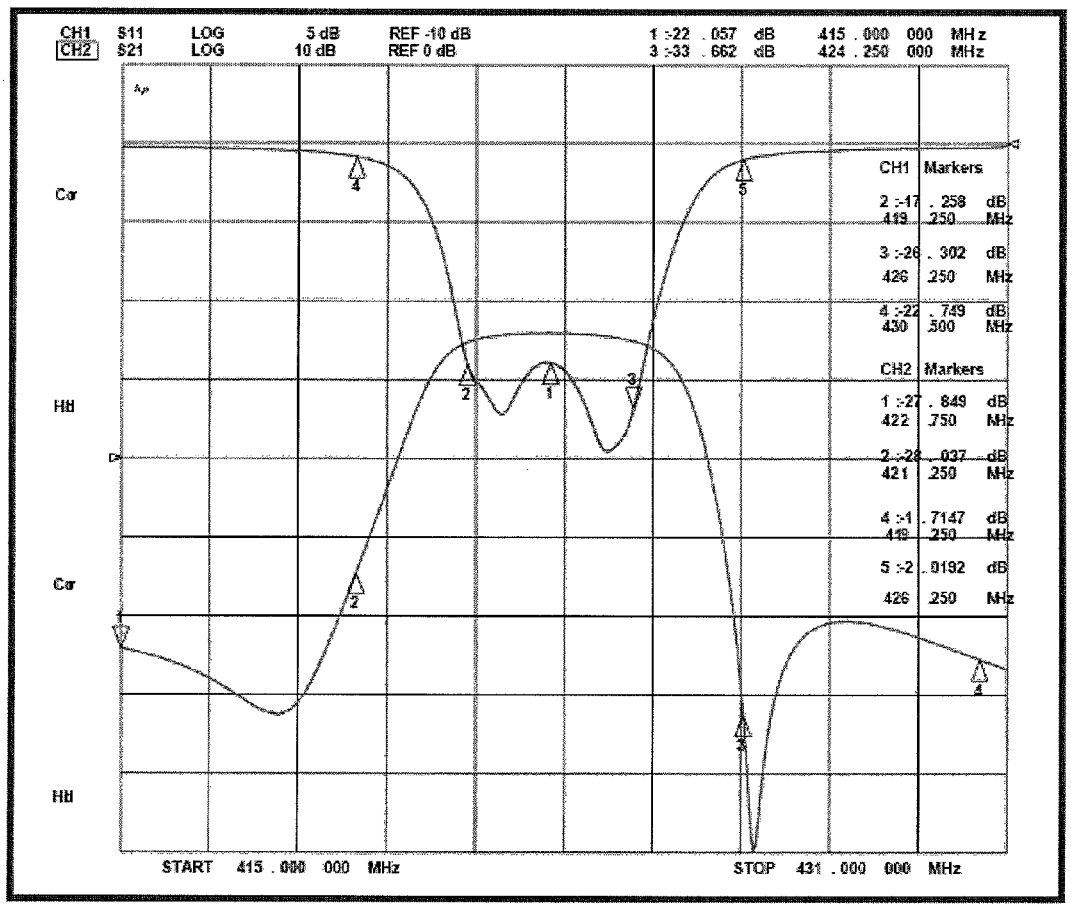
FIG. 1 illustrates the frequency response of a conventional type of notch filter.
Figure 2:
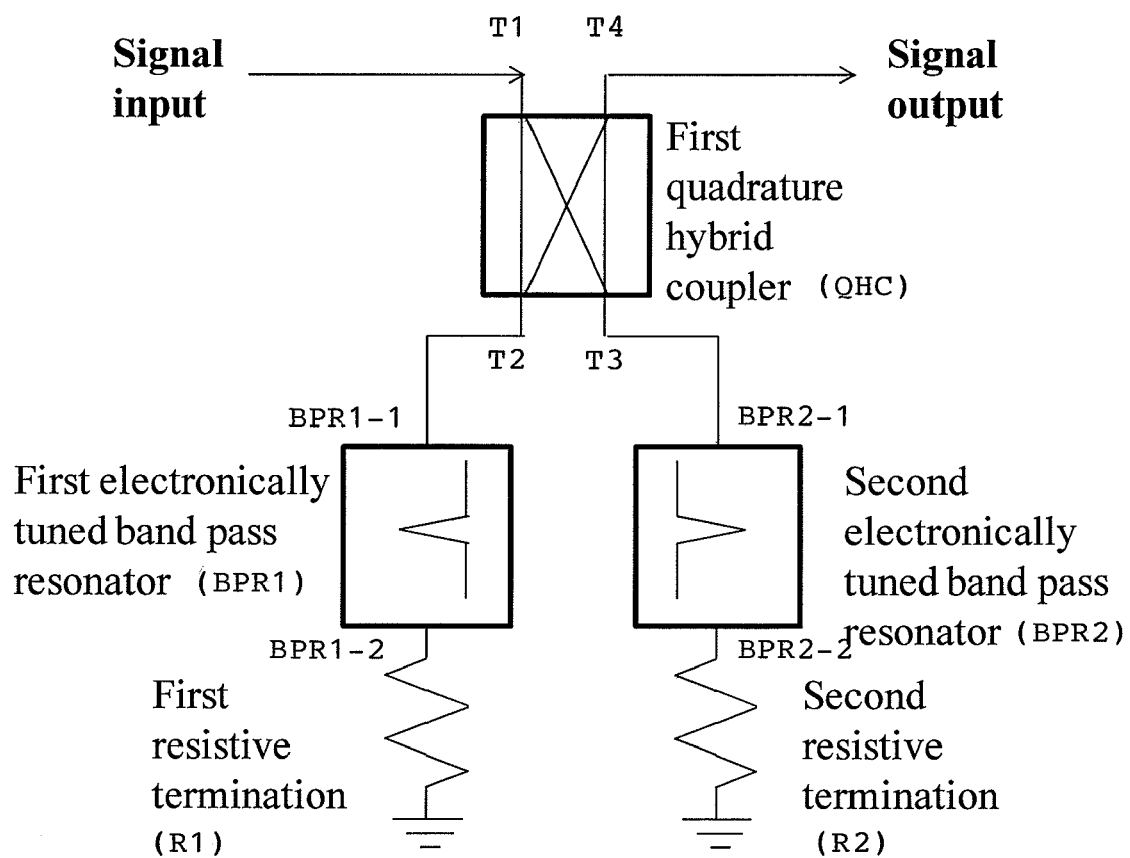
FIG. 2 is a schematic diagram of an electronically tunable, absorptive, low-loss, notch filter in accordance with the present invention.

A preferred embodiment of an electronically tunable, absorptive, low-loss notch filter is illustrated schematically in FIGS. 2 and 3. Referring to FIG. 2, a quadrature hybrid coupler QHC has a first terminal T1 for receiving a signal input, a second terminal T2 for one of equal-amplitude 90 degrees out-of-phase tandem outgoing signals converted and passed from the quadrature hybrid coupler, a third terminal T3 for the other of the equal-amplitude 90 degrees out-of-phase tandem outgoing signals, and a fourth terminal T4 for outputting a signal output. A first electronically tuned band pass resonator BPR1 has a first terminal BPR1-1 connected to the second terminal T2 of the quadrature hybrid coupler QHC, and a second terminal BPR1-2 connected to the high side of a first resistive termination R1 which has an impedance matched to the impedance of the notch filter (typically 50 ohms). A second electronically tuned band pass resonator BPR2 has a first terminal BRP2-1 connected to the third terminal T3 of the quadrature hybrid coupler QHC, and a second terminal BPR2-2 connected to the high side of a second resistive termination R2 which has an impedance matched to the impedance of the notch filter (typically 50 ohms). The low sides of the first and second resistive terminations R1, R2 are connected to a ground termination.

Figures 3A, 3B, 3C:
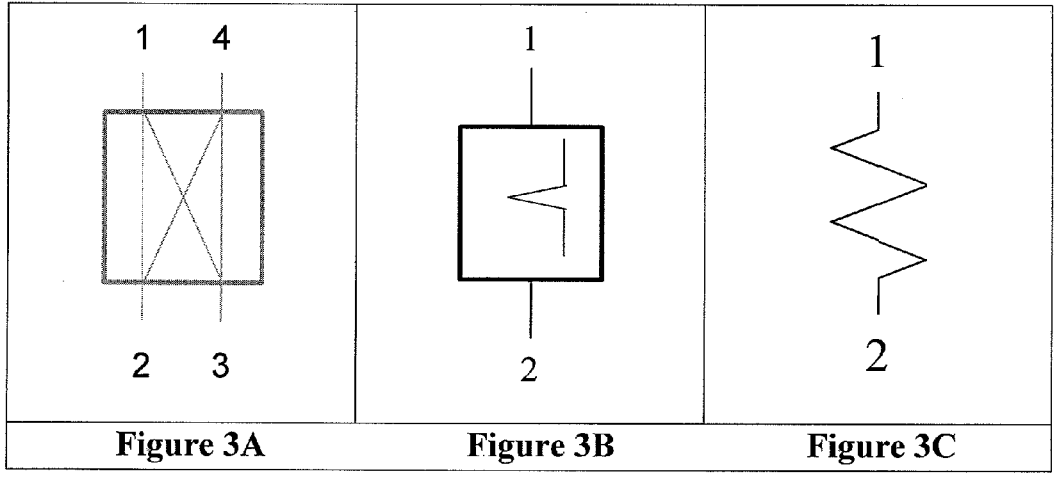
FIGS. 3A, 3B, and 3C illustrate the terminal designations for the quadrature hybrid coupler, electronically tuned band pass resonator, and resistive termination circuits of the invention notch filter, respectively.

FIGS. 3A, 3B, and 3C illustrate the terminal designations for the quadrature hybrid coupler QHC, electronically tuned band pass resonator BRP, and resistive termination R circuits of the invention notch filter, respectively.

In the preferred method of operating the notch filter, both the first and second electronically tuned band pass resonators BRP1, BRP2 are a matching pair and have their frequencies tuned equal to the frequency desired to be passed by the notch filter. The method for setting the frequency of the electronically tuned band pass resonator is described further below.

Figures 4A, 4B, 4C:
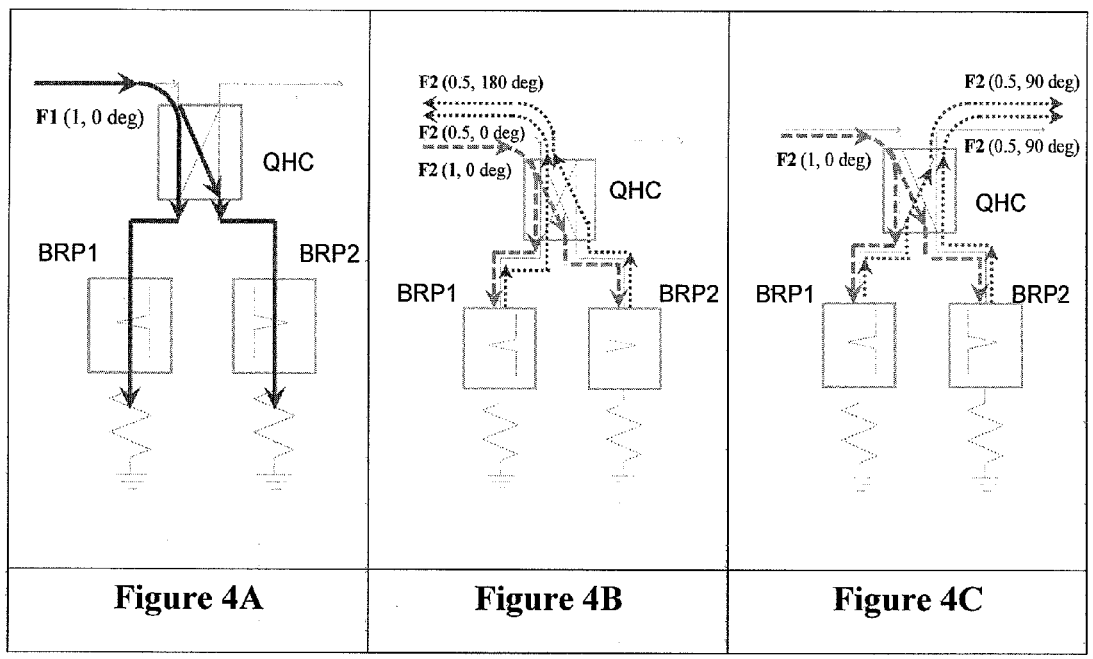
FIGS. 4A, 4B, and 4C illustrate termination of out-of-band signals, canceling of opposite-phase in-band signals at the input terminal, and reinforcement of in-phase in-band signals at the output terminal, respectively, of the quadrature hybrid coupler.

Referring to FIGS. 4A, 4B, and 4C, the quadrature hybrid coupler in operation accepts a signal input injected into the first terminal T1 and splits the signal into two equal amplitude paths, 90 degrees out of phase, and passes the outgoing signals to the second and third terminals T2, T3. The fourth terminal T4 is isolated from the first terminal T1. The level of isolation between the first and fourth terminals is a limiting factor in the depth of the notch filter, thus every effort is made to maximize this isolation. The quadrature hybrid acts as a power divider from the input direction, which is the case when a signal comes in from terminal T1 and is split into two equal signals 90 degrees out of phase that are passed to T2 and T3, and as a power combiner from the reflection direction, which is the case when two signals are reflected back at terminals T2 and T3 that are out of phase by 90 degrees. Under this condition, the combined signal passed to terminal T4 is the summation of the signals reflected to terminals T2 and T3, while the input terminal T1 is isolated from the output terminal T4.

In FIG. 4A, an signal input F1, indicated as having a "1" level of amplitude and "0" degrees phase, is input to the first terminal T1 of the quadrature hybrid coupler QHC, and is split into an outgoing signal of 0.5 amplitude and 0 degrees phase passed to the first band pass resonator BPR1, and an outgoing signal of 0.5 amplitude and 90 degrees phase to the second band pass resonator BPR2. The first and second band pass resonators are tuned to pass a frequency f1 of the signal input F1. Therefore, the frequency f1 signal continues through the first and second band pass resonators and is absorbed into the first and second resistive termination. No energy is reflected back towards the quadrature hybrid coupler. This provides the notch filter with an absorptive response at the notch frequency, and no signal energy is allowed to pass, resulting in the notch filter having a notch at frequency f1.

Now, in FIGS. 4B and 4C, when a signal input F2 of an out-of-notch frequency f2 is injected into the first terminal T1 of the quadrature hybrid coupler QHC, it is split into an outgoing signal of 0.5 amplitude and 0 degrees phase passed to the first band pass resonator BPR1, and an outgoing signal of 0.5 amplitude and 90 degrees phase to the second band pass resonator BPR2. Since the first and second band pass resonators are tuned to pass frequency f1, they reject all other out-of-band frequencies. Therefore, the frequency f2 signal is reflected back from the band pass resonators towards the second and third terminals T2, T3 and are combined through the quadrature hybrid coupler QHC. The frequency f2 signal of 0.5 amplitude and 0 degrees phase from the first band pass resonator BRP1 is reflected back to terminal T2. The frequency f2 signal of 0.5 amplitude and 90 degrees phase from the second band pass resonator BRP2 is reflected back to terminal T3. The reflected signals are combined through the quadrature hybrid coupler and passed to terminals T1 and T4. At the output terminal T4, the signal at 0 degrees phase from the first band pass resonator BRP1 is shifted to 90 degrees phase and combined with the signal at 90 degrees phase from the second band pass resonator BRP2 which remains at 90 degrees phase. Thus, a combined output signal F2 of 1.0 amplitude and 90 degrees phase is passed to the output terminal T4 as a full signal F2 at all out-of-notch frequencies f2 with little or no loss. At the input terminal T1, the signal at 0 degrees phase from the first band pass resonator BRP1 remains at 90 degrees phase and is combined with the signal at 90 degrees phase from the second band pass resonator BRP2 which is converted to 180 degrees phase. Since the combined signals at the input terminal T1 are 180 degrees out-of-phase, they cancel and have no reverberation effect on the transmitter circuit connected to the input terminal T1.

Using this example, an absorptive notch filter is created by tuning a matched pair of first and second electronically tuned band pass resonators to the frequency at which the notch is to be created, referred to above as frequency f1, resulting in absorption of the f1 signal. All other out-of-notch frequencies f2 will be passed from the input terminal T1 to the output terminal T4 of the notch filter. The preferred notch filter circuit is composed of quadrature hybrid coupler, first and second band pass resonators, and first and second resistive terminations which are symmetric, so all of the sequences described above would occur reciprocally if an input signal is injected into the fourth terminal of the quadrature hybrid coupler instead of the first terminal.

Figure 5:
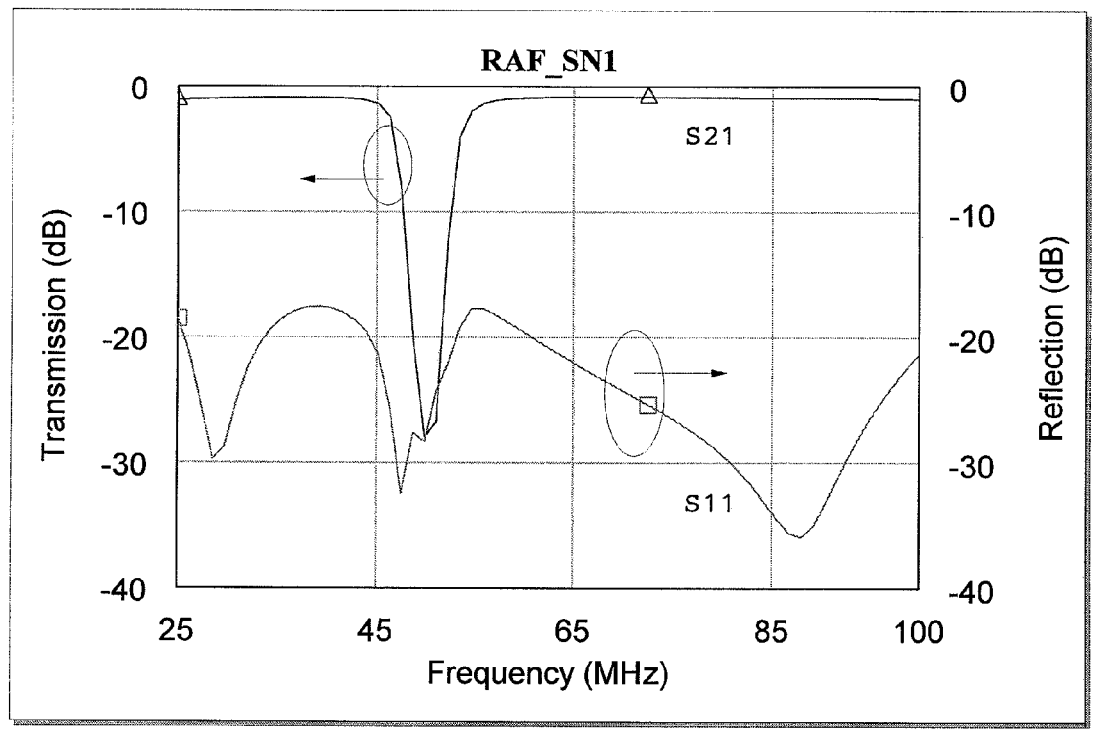
FIG. 5 shows the frequency response of the invention notch filter.

FIG. 5 illustrates a measurement of the frequency performance of the notch filter. The signal transmission characteristic (top curve, left axis) is representative of a band reject filter. Unlike a traditional band reject filter, however, the reflection characteristic (bottom curve, right axis) presents a good return loss, even at the notch frequency. The quadrature hybrid coupler, first and second band pass resonators, and first and second resistive terminations are configured as described above. Both first and second band pass resonators are tuned to the same frequency f1. A better than −15 dB reflection coefficient is sustained over the entire band. This is in stark contrast to a conventional band reject filter which would typically present almost a unity reflection coefficient (0 dB) at the notch frequency.

Figure 6:
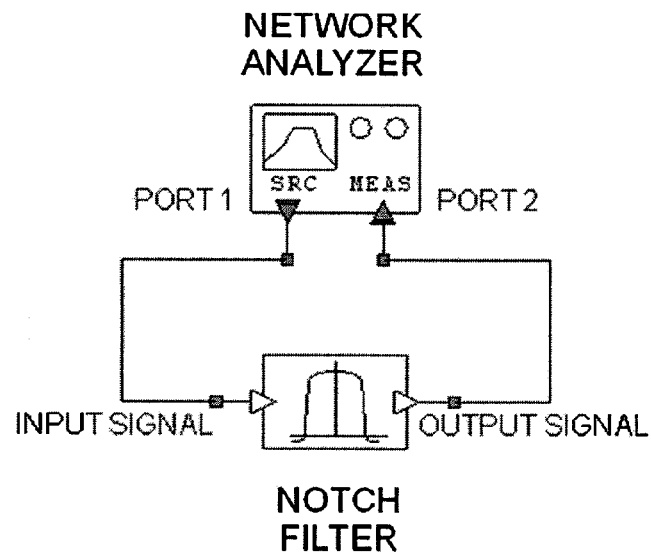
FIG. 6 shows a test setup to measure the notch filter response.

FIG. 6 shows a test setup to measure the notch filter response. Using a network analyzer, a two-port measurement can be performed to measure the response of the notch filter. Port 1 of the network analyzer is connected to the "signal input" terminal T1, and Port 2 is connected to the "signal output" terminal as shown in FIG. 2. The response of the notch filter is measured, resulting in the S21 (forward transmission) response as well as the S11 (reverse reflection) response in FIG. 5.

Figure 7:
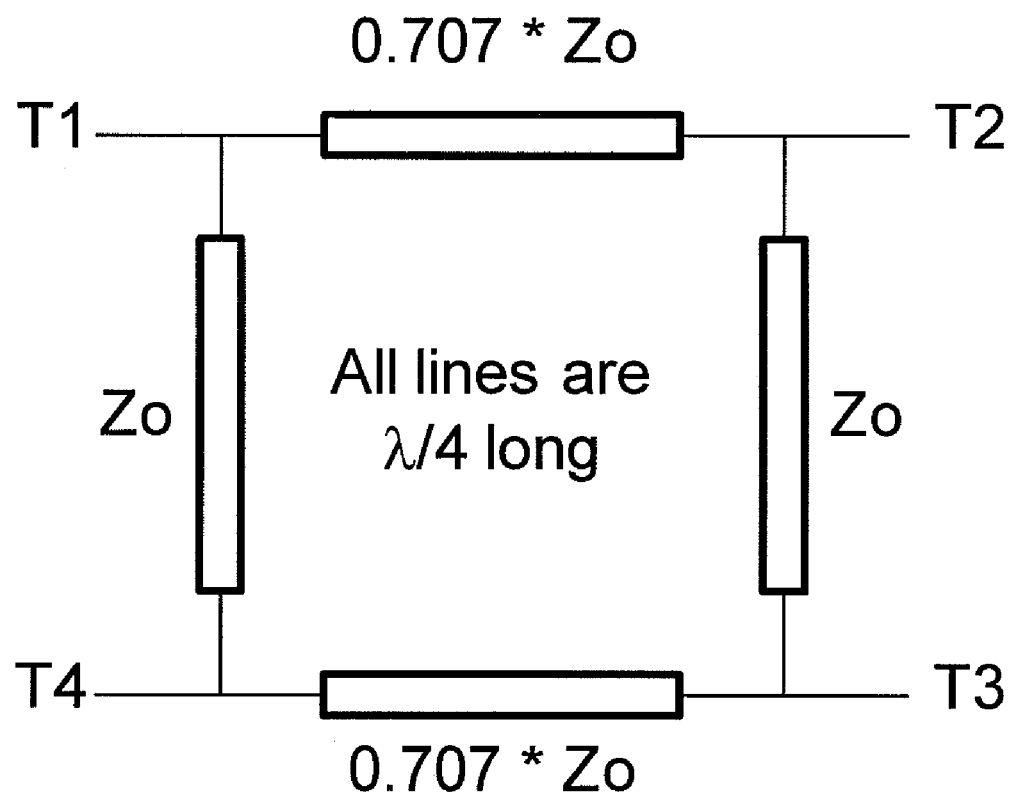
FIG. 7 shows an example of a quadrature hybrid coupler circuit for the notch filter.

There are many different ways of realizing a quadrature hybrid coupler. FIG. 7 shows one example of a quadrature hybrid coupler circuit that may be used for the notch filter. The four terminals of the of a quadrature hybrid coupler are again labeled as terminals T1-T4. T1 is commonly referred to as the "sum" terminal, T4 the "isolated" terminal, T2 the "through" terminal, and T3 the "coupled" terminal. Zo represents the characteristic impedance of the system, and each of the branch arms are 90 degrees long at the design frequency. A signal injected into T1 is isolated to T4 which means that none of T1 arrives at T4. Half of the signal at T1 shows up at T2 and the other half at T3. The two signals undergo a phase shift relative to each other that result in the signals at T3 becoming 90 degrees out of phase with T2. This sequence of events is how a quadrature hybrid coupler is used as a 3 dB power divider from the direction of the incoming signal. Conversely, signals reflected by the resonator circuits back to T2 and T3 that are 90 degrees out of phase with each other will arrive at T4 in phase and will therefore sum. At T1, the reflected signals arrive 180 degrees out of phase and cancel, therefore no signal energy is reflected back to T1. This is how a quadrature hybrid coupler is used as a power combiner from the direction of the reflected signals. An example of a quadrature hybrid coupler of this type is commercially available from Werlatone, Inc., of Brewster, N.Y., sold under part number QH8279.

In FIG. 8A, an example of an electronically tunable high power band pass resonator is shown comprised of a combination of capacitors, inductors, and electronic control elements such as PIN diodes. A first series capacitor C1 is connected to a first series inductor L1 which is connected to a diode D1 which in turn is connected to a second series capacitor C2. A first shunt capacitor C3 couples the connection between the first series capacitor C1 and the first series inductor L1 to ground. A second shunt capacitor C4 couples the connection between the diode D1 and the second series capacitor C2 to ground. The combination of the first series inductor L1 and first series diode D1 is one of a plurality of parallel inductor/diode connections, as represented by inductors L1, L2, through Lx, and diodes D1, D2, through Dx, comprising an electronic tuning mechanism. Each diode is either turned on to present a low resistance path or turned off to present a high resistance path which adjusts the total amount of inductance presented by the plurality of parallel combinations. When the diode is turned off, the function of diode resistors R1, R2, through Rx is to present a maximum parallel resistance between the first and second terminals of the diode. Without this resistor, the voltage across the first and second terminals of the diode is poorly defined and can easily approach levels which can cause the diode to enter into a reverse breakdown condition. This resistor is chosen to be sufficient large so as to not exceed the equivalent parallel impedance of the junction capacitance of the diode at the highest frequency of operation.

In the described configuration, inductors can be substituted for the capacitors, and capacitors can be substituted for inductors. As shown in the alternate embodiment in FIG. 8B, a first series inductor L1 is connected to a first series capacitor C1, which is connected to a diode D1, which in turn is connected to a second series inductor L2. A first shunt inductor L3 couples the connection between the first series inductor L1 and the first series capacitor C1 to ground. A second shunt inductor L4 couples the connection between the diode D1 and the second series inductor L2 to ground. The combination of the first series capacitor C1 and first series diode D1 is one of a plurality of parallel capacitor/diode connections, as represented by capacitors C1, C2, through Cx, and diodes D1, D2, through Dx, comprising an electronic tuning mechanism. The functionality of the alternate embodiment remains the same as the first described embodiment in FIG. 8A. The important point is that all three poles reside at the same frequency, which provides its characteristic as a resonator. The resonator can either be characterized as a band pass section in cascade with a high pass section or as a high pass section in cascade with a low pass section. The preferred resonator circuit contains at least two poles that lie at a single common frequency and is therefore tunable with a single series element. The single series-tunable element can thus be either an inductor (as in FIG. 8A) or a capacitor (as in FIG. 8B). It is part of a parallel array of such series-tunable elements whose on/off status are selectively set to result in the desired tuning frequency. The single series-tunable element has an effective value which is determined by how many of the parallel elements are activated.

FIG. 8C depicts the method by which the diodes are turned on and off to set the low and high impedance conditions for electronic tuning. The inductors labeled RFC1 and RFC2 are RF chokes which are intended to provide a high impedance at all frequencies except DC. The capacitors DCC1 and DCC2 present a low impedance at all frequencies except DC. Together, these elements ensure that none of the RF energy leaks away from the intended signal path and into the bias circuitry. A positive supply voltage labeled +5V sets a bias current through Rb. If the control signal labeled CTL is equal to the positive supply voltage, the diode second terminal is held to ground, allowing current to conduct through the diode and creating a low impedance path. If the control signal labeled CTL is equal to ground, the pullup resistor Rp pulls the diode second terminal up to the positive supply voltage which disallows current to flow through the diode, creating a high impedance path. Thus, by switching CTL from low to high, at high speeds if necessary, electronic tuning of the effective parallel inductance or capacitance can occur. The alteration of the effective parallel inductance or capacitance shifts the frequency of the band pass resonator thereby effecting electronic tuning of the entire notch filter frequency.

The above-described notch filter architecture achieves the performance characteristics of a notch filter without using a conventional notch filter configuration, but rather uses the reciprocal of a notch filter which is a band pass filter. In this architecture, the band pass filter pass-band is a narrow band, and the band pass filter stop band is a wide band. The narrow band performance of the band pass filter sets the frequency for which the embodied architecture presents a frequency notch. The wide band response of the band pass filter reflects energy desired to be passed by the embodied architecture, and it is the reflection coefficient in the wide band response of the stop band that performs this function.

Figure 9:
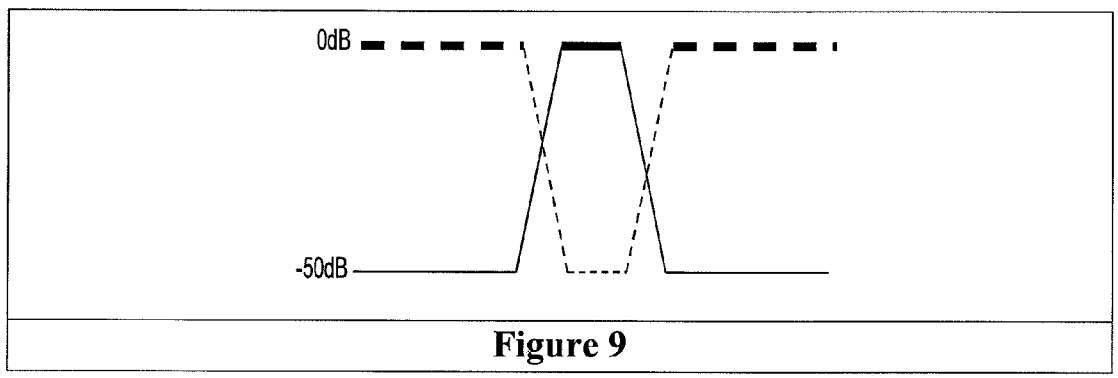
FIG. 9 shows the signal response of a typical band pass filter.

FIG. 9 provides an illustration of a typical band pass filter response for both transmission (S21) and reflection (S11). The S21 is represented by the dashed curve and the S11 is represented by the solid curve. This illustration demonstrates that the reflection coefficient in the wide band portion of the stop band of the band pass filter determines the wide band performance of the pass band for the embodied notch filter. Further, all band pass filters far away from resonance have reflection coefficients that tend towards 0 dB which is a perfect reflection coefficient. Therefore, the only loss mechanism for the embodied notch filter is due to the loss in the quadrature hybrid which can be designed to be much lower than the typical loss expected in a conventional notch filter.

For the application of creating a notch filter using band pass elements as in the above-described embodiment, use of a resonator is sufficient rather than use of a full filter. Band pass resonators require fewer components than filters and can be designed to handle greater power levels than an equivalent band pass filter. An electronically tuned resonator has a power handling characteristic that is inversely proportional to the quality factor of the filter. In other words, the higher the quality factor, the lower the power handling. This is because a high quality factor results in a high resonator impedance at resonance. The higher the resonator impedance, the higher the voltage seen by the elements within the resonator. When a component reaches its voltage tolerance, it begins to fail and thus the resonator performance is destroyed. When comparing a notch filter to a band pass filter, the impedance step seen at resonance is typically 4 times greater for the notch filter than it is for the band pass filter, resulting in a 4 times reduction in power handling. Thus, it is advantageous to use band pass filter circuit architectures when creating a notch filter for high power applications. Since a resonator requires fewer components than a filter, the resonator in the described embodiment can be designed with superior power handling over a filter because of relaxed design constraints.

Further improvements in resonator power handling can be achieved by recognizing the power handling limits of band pass resonators. Electronically tunable band pass resonators are typically tuned using an electronic switching element such as a diode or transistor. The diode or transistor has both a current and voltage limitation that often determines the power handling of the band pass filter, and not the other components which are the inductors and capacitors. In order to achieve fast tuning speeds measured in nanoseconds or microseconds, solid state switching technology such as PIN diodes, gallium arsenide, or other such high speed technologies must be used. Mechanical, or electro-mechanical, switching technologies are incapable of achieving the stated switching speeds.

Figures 10A, 10B:
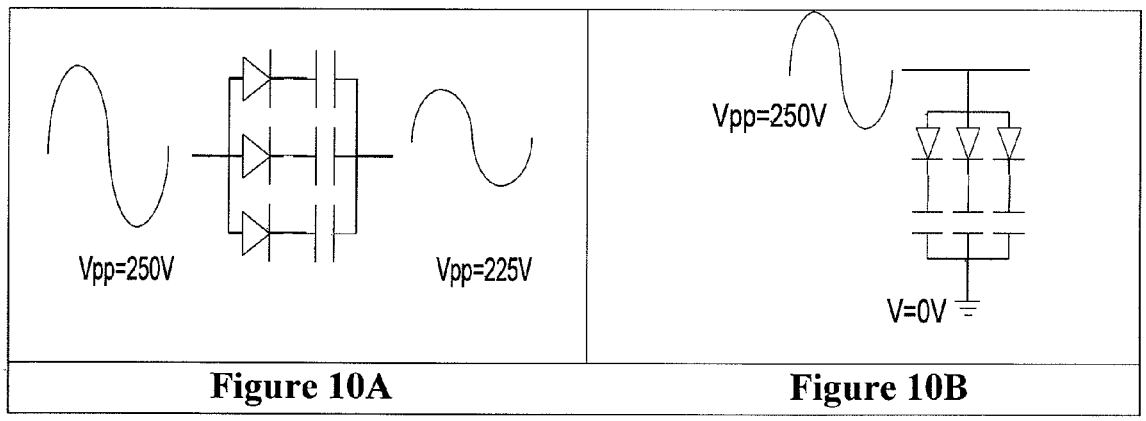
FIGS. 10A and 10B show a series diode versus a shunt diode configuration, respectively.

In the preferred embodiments of the present invention, the use of diodes for the electronically tuned resonators is preferred, although the limitations of transistors are roughly the same. The power handling of diode resonators is strained when considering the impedance mismatch at the resonator ports which tends to increase the peak voltages and currents seen by the diodes. The current handling of PIN diodes is quite high with only moderate requirements for thermal conduction to sustain high current levels. The reverse breakdown voltage, however, is a "hard" number and cannot be improved by better thermal management, and thus greater emphasis is placed on the minimization of voltage stress for diode reliability. In general, it is the shunt diodes that limit power handling, since it sees a very high peak voltage relative to ground. Series diodes see only a small voltage difference across their terminals, even if the absolute voltages are still quite large. This is illustrated in FIG. 10A, in which the series diode has a voltage difference across the diode of only 25V, even though the absolute voltages are high (250V and 225V, respectively). In contrast, the shunt configuration in FIG. 10B has the full peak voltage of 250V across the diode, since one of the diode terminals is at ground potential. Therefore, when considering the implications of impedance mismatch, high Q resonant voltages, and the differences in voltage potential between series and shunt elements, it becomes advantageous to design a tunable resonator that requires only the use of series tuning elements to maximize power handling.

Figure 11:
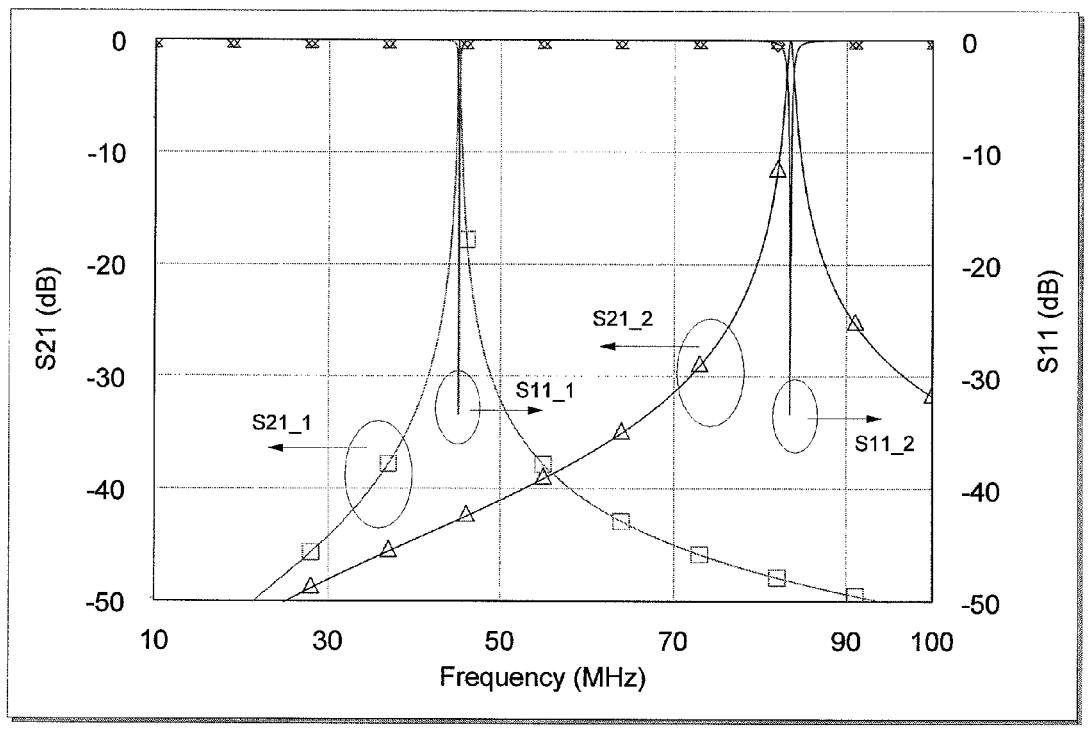
FIG. 11 shows a simulated tuning response of a series-only electronically tunable resonator.
Figure 12:
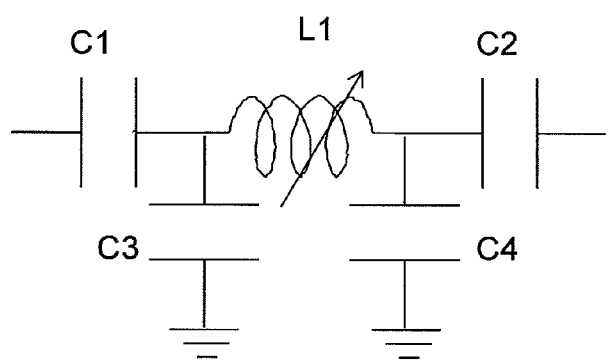
FIG. 12 is a schematic diagram of the series-only electronically tunable resonator.

Generally speaking, capacitors have higher Q values than inductors resulting in lower loss resonators. Capacitors are also more compact, reducing parasitic elements which further reduces losses but more importantly allows for improved tuning range. In addition to the above mentioned benefits, use of only series elements for the tuning dramatically improves the power handling of the PIN diode switching elements. Simulated data of a series-only tunable resonator is given in FIG. 11. FIG. 12 depicts the circuit used to generate the simulation. Inductor L1 is indicated to be tunable by the arrow drawn through it. Capacitors C1 through C4 are fixed and do not vary during the tuning process. Capacitors C1 and C2 may be set equal to 4.7 pF, and capacitors C3 and C4 may be set equal to 56 pF. In FIG. 11, the S21_1 and S21_2 traces represent the S21 response of the series-only electronically tunable filter, and the S11_1 and S11_2 traces representing the S11 response of the series-only electronically tunable filter. Inductor L1 is tuned to a value of 408 nH to realize the S21_1 and S11_1 traces shown in FIG. 11. Inductor L2 is then tuned to a value of 112 nH to realize the S21_2 and S11_2 traces shown in FIG. 11. This series-only electronically tuned resonator has a constant Q, thus the S21_2 response is broader than the S21_1 response due to the higher frequency.

The use of bandpass resonators that have only series tunable elements thus provides important advantages to enable handling of high power transmission applications. "High power" can be defined as in the range of 100 watts or more. Conventional power handling for a notch filter that is electronically tunable but not absorptive is in the range of about 10 watts or less. Absorptive, electronically tunable notch filters are not generally known in the prior art at any power level. The order-of-magnitude higher power handling characteristics of the described embodiments is attributed firstly to the use of the electronically tunable band pass resonators rather than a conventional filter. This results in fewer components which means less filtering loss. Lower loss reduces the amount of heat dissipated in the structure, which allows for greater RF power levels to be handled. Second, the band pass resonator higher power handling characteristics is also attributed to the requirement for tuning only the center series element (either the inductors labeled L1-Lx or the capacitors labeled C1-CX), which can be done using purely series PIN diodes. This limits the amount of reverse bias voltage that is presented across the PIN diodes when they are biased off. If this approach was not used, then the PIN diodes would need to be stacked to handle the reverse bias voltage which raises their on-state loss. A higher on-state loss implies greater heat required to be dissipated in the structure.

FIG. 13A illustrates use of the notch filter at the output of a final transmitter, such as in a wireless transmission system, while FIG. 13B illustrates use of the notch filter at the input of the final transmitter. Both scenarios have the notch filter tuned to remove an offending (potentially interfering) signal from the transmitter. The most common method for using a notch filter in a transmitter is to remove the noise generated by the transmitter itself. Even if the transmitter is transmitting on a frequency that differs from the desired receive signal frequency, the noise generated by the transmitter itself can often be sufficient to impair the receiver from properly receiving the desired signal. Thus, a notch filter is placed at the output of the transmitter to remove all of the noise from the desired receive frequency. The final transmitter in the transmitter chain is often the highest power and therefore the noisiest. Placing the notch filter at the location shown in FIG. 13A is optimal since it can remove the cumulative noise contribution of all transmitters including the highest power transmitter. In order for this to occur, the notch filter must be capable of tolerating the full extent of the power of the final transmitter. It is also highly desirable to have the notch filter be absorptive so as to not reflect the energy at the notch frequency back to the transmitter. This reflected energy can cause a phenomenon known as reverse intermodulation distortion which creates new signals which can become new sources of interference for the receivers. This reflected energy can also physically damage the transmitter if the power becomes too high. If the notch filter is incapable of tolerating the full power of the final transmitter, then it must be placed as in FIG. 13B which does not remove as much transmitter noise as in FIG. 13A.

In summary, a notch filter architecture and a method of operating it have been disclosed for realizing an electronically tuned, absorptive, low-loss notch filter that can be electronically tuned at high tuning speeds. The preferred embodiments use a quadrature hybrid coupler, series-only electronically tunable resonators, and resistive terminations as an effective means to pass only desired frequencies by placing the notch filter at the output of a transmitter for maximum effectiveness. The notch filter architecture and method can be used for signal interference cancellation in a wide range of wireless technologies, such as cellular phone, wireless routers, hand-held radios, satellite communications, and any other environments where there are a number of wireless technologies in close signal proximity.

It is to be understood that many modifications and variations may be devised given the above described principles of the invention. It is intended that all such modifications and variations be considered as within the spirit and scope of this invention, as defined in the following claims.

The invention claimed is:

1. An electronic tunable, absorptive, low-loss notch filter comprising:
    a quadrature hybrid coupler with first, second, third, and fourth terminals, wherein the first terminal is a signal input terminal, the fourth terminal is a signal output terminal, and the second and third terminals are connected to respective electronically tuned band pass resonators in tandem, wherein the quadrature hybrid coupler operates to convert an incoming signal to the first terminal into two outgoing signals of equal amplitude and 90 degrees out of phase with the other which are passed to respective ones of the second and third terminals;
    a first electronically tuned band pass resonator having first and second terminals, wherein the second terminal of the quadrature hybrid coupler is connected to the first terminal of the first electronically tuned band pass resonator;
    a first resistive termination whose impedance is matched to an overall impedance of the notch filter, having a high side terminal connected to the second terminal of the first electronically tuned band pass resonator, and a low side terminal connected to a ground termination;
    a second electronically tuned band pass resonator having first and second terminals, wherein the third terminal of the quadrature hybrid coupler is connected to the first terminal of the second electronically tuned band pass resonator; and
    a second resistive termination whose impedance is matched to the overall impedance of the notch filter, having a high side terminal connected to the second terminal of the second electronically tuned band pass resonator, and a low side terminal connected to the ground termination,
    wherein both the first and second electronically tuned band pass resonators are a matching pair and are tuned to respective frequencies equal to a notch frequency to be notched by the notch filter.

2. An electronic tunable, absorptive, low-loss notch filter according to claim 1, wherein an incoming signal at a frequency to be notched by said notch filter is injected to the first terminal of the quadrature hybrid coupler and is passed by the first and second electronically tuned band pass resonators and absorbed into the first and second resistive terminations.

3. An electronic tunable, absorptive, low-loss notch filter according to claim 1, wherein an incoming signal at an out-of-notch frequency is injected to the first terminal of the quadrature hybrid coupler and is reflected back from the first and second band pass resonators as reflected signals which are combined, resulting in reflected signals passed to the first terminal of the quadrature hybrid coupler that are 180 degrees out-of-phase and cancel each other, and reflected signals passed to the fourth terminal of the quadrature hybrid coupler that are in-phase and reinforce each other so as to pass a full out-of-notch frequency signal from the notch filter with little or no loss.

4. An electronic tunable, absorptive, low-loss notch filter according to claim 1, wherein the first and second electronically tunable band pass resonators comprise only series tunable elements.

5. An electronic tunable, absorptive, low-loss notch filter according to claim 4, wherein the first and second electronically tunable band pass resonators each comprise an on/off control element in series with a center tuning element to minimize power dissipation and enable handling of high power uses.

6. An electronic tunable, absorptive, low-loss notch filter according to claim 5, wherein said on/off control element comprises a plurality of on/off control elements, and said center tuning element comprises a plurality of center tuning elements, and the first and second electronically tunable band pass resonators each comprise an array in parallel of series connections of a respective one of said plurality of on/off control elements in series with a respective one of said plurality of center tuning elements as a selectable electronic tuning mechanism.

7. An electronic tunable, absorptive, low-loss notch filter according to claim 4, wherein the first and second electronically tunable band pass resonators each comprise a PIN diode in series with a center tuning inductor.

8. An electronic tunable, absorptive, low-loss notch filter according to claim 4, wherein each of the band pass resonators has a first series capacitor connected by a connection to a first series inductor which is connected to a diode which in turn is connected by a connection to a second series capacitor, a first shunt capacitor coupling the connection between the first series capacitor and the first series inductor to a ground, and a second shunt capacitor coupling the connection between the diode and the second series capacitor to the ground, said first series inductor and first series diode being one of a plurality of parallel inductor/diode connections comprising an electronic tuning mechanism.

9. An electronic tunable, absorptive, low-loss notch filter according to claim 4, wherein each of the band pass resonators has a first series inductor connected by a connection to a first series capacitor, which is connected to a diode, which in turn is connected by a connection to a second series inductor, a first shunt inductor coupling the connection between the first series inductor and the first series capacitor to a ground, and a second shunt inductor coupling the connection between the diode and the second series inductor to the ground, said first series capacitor and first series diode being one of a plurality of parallel capacitor/diode connections comprising an electronic tuning mechanism.

10. An electronic tunable, absorptive, low-loss notch filter according to claim 1, wherein the signal transmission characteristic of said notch filter is representative of a band reject filter.

11. An electronic tunable, absorptive, low-loss notch filter according to claim 1, wherein said notch filter has a reflection characteristic that represents a low reflection.

12. An electronic tunable, absorptive, low-loss notch filter according to claim 11, wherein a better than −15 dB reflection coefficient is sustained over an entire band.

13. A method of operating a notch filter comprising:
    providing a quadrature hybrid coupler with first, second, third, and fourth terminals, wherein the first terminal is a signal input terminal, the fourth terminal is a signal output terminal, and the second and third terminals are connected to respective electronically tuned band pass resonators in tandem, wherein the quadrature hybrid coupler operates to split an incoming signal at the first terminal to two outgoing signals of equal amplitude and 90 degrees out of phase with the other which are passed to respective ones of the second and third terminals;

providing a matched pair of electronically tuned band pass resonators connected to respective ones of the second and third terminals of the quadrature hybrid coupler and having respective resistive terminations each of which has an impedance matched to an overall impedance of the notch filter;

tuning the first and second electronically tuned band pass resonators to a frequency to be notched by the notch filter;

wherein an incoming signal at the frequency to be notched by said notch filter injected to the first terminal of the quadrature hybrid coupler results in signals passed by the first and second electronically tuned band pass resonators and absorbed into the first and second resistive terminations, and wherein an incoming signal at an out-of-notch frequency injected to the first terminal of the quadrature hybrid coupler results in reflected signals reflected back from the first and second band pass resonators that undergo a second phase shift through the quadrature hybrid coupler, resulting in the reflected signals being passed to the first terminal that are 180 degrees out-of-phase and which cancel each other, and the reflected signals being passed to the fourth terminal that are in-phase and which reinforce each other so as to pass a full out-of-notch frequency signal from the notch filter with little or no loss.

14. A method of operating a notch filter according to claim 13, wherein the first and second electronically tunable band pass resonators each comprise an on/off control element in series with a center tuning element to minimize power dissipation and enable handling of high power uses.

15. A method of operating a notch filter according to claim 14, wherein the first and second electronically tunable band pass resonators each comprise a PIN diode in series with a center tuning inductor.

16. A method of operating a notch filter according to claim 13, wherein the first and second electronically tunable band pass resonators each comprise a PIN diode in series with a center tuning capacitor.

17. A method of operating a notch filter according to claim 13, wherein said notch filter has a signal transmission characteristic representative of a band reject filter.

18. A method of operating a notch filter according to claim 13, wherein said notch filter has a characteristic that represents an electronic tunable, absorptive, low-loss notch filter capable of handling high power RF transmission uses.

* * * * *